United States Patent [19]

Boudewijns

[11] Patent Number: 5,138,281
[45] Date of Patent: Aug. 11, 1992

[54] APPARATUS FOR MAINTAINING THE FREQUENCY OF AN OSCILLATOR WITHIN A PREDETERMINED FREQUENCY RANGE

[75] Inventor: Arnoldus J. J. Boudewijns, Eindhoven, Netherlands

[73] Assignee: U.S. Philips Corporation, New York, N.Y.

[21] Appl. No.: 731,842

[22] Filed: Jul. 16, 1991

[30] Foreign Application Priority Data

Jul. 20, 1990 [EP] European Pat. Off. ......... 90201970.2

[51] Int. Cl.[5] .............................................. H03L 7/00
[52] U.S. Cl. ....................................... 331/1 A; 331/8; 331/10; 331/25
[58] Field of Search ....................... 331/1 A, 8, 10, 11, 331/17, 25

[56] References Cited

U.S. PATENT DOCUMENTS 4,229,759 10/1980 Harwood et al. ................. 331/25 X
4,682,209 7/1987 Nillesen ................................. 358/19

FOREIGN PATENT DOCUMENTS 2132430 7/1984 United Kingdom .

*Primary Examiner*—Robert J. Pascal
*Attorney, Agent, or Firm*—Bernard Franzblau

[57] ABSTRACT

The frequency of a local oscillator is maintained within a small frequency window around any one of a number of reference frequencies so that it can lock onto the frequency of an incoming color burst (CHRM). The oscillator (10) may be a current-controlled oscillator. Its control input is switched via a fet (32) to a capacitor (20) charged to a voltage level which will, when connected to the oscillator control input, result in the correct oscillator frequency (Fo). The connection to this capacitor (20) is made when the charge on either one of two control capacitors (22,24) exceeds a threshold value. The threshold values are exceeded when the local oscillator frequency (Fo) is respectively greater than or less than the reference frequency (Fr) by a predetermined frequency difference.

20 Claims, 2 Drawing Sheets

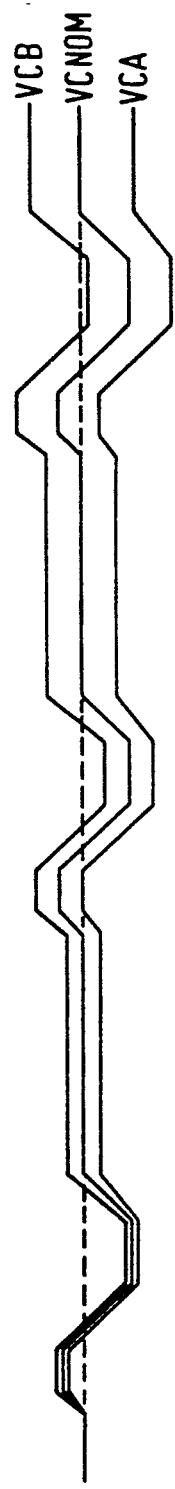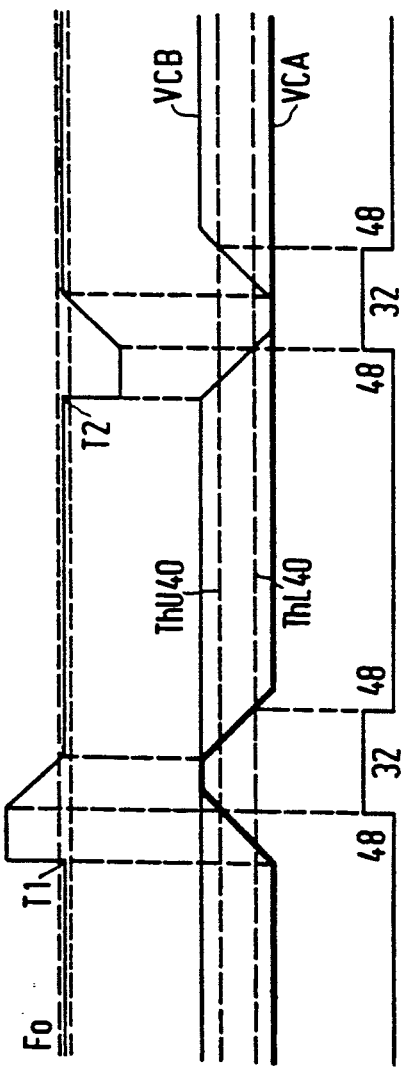

APPARATUS FOR MAINTAINING THE FREQUENCY OF AN OSCILLATOR WITHIN A PREDETERMINED FREQUENCY RANGE

BACKGROUND OF THE INVENTION

The present invention relates to the regulation of the frequency or frequencies of oscillators, which may find application in a circuit for maintaining the frequency of the local oscillator used in color signal demodulation within a predetermined range, so that it can be locked to the incoming color burst signal.

At present, many color decoders used in multi-standard color television receivers use a number of crystals to generate reference frequencies for the different color systems. Since both the crystals and the associated electric circuitry have tolerances, correct locking of the local color subcarrier to the incoming color burst can only be assured if these frequencies are controlled to be within a relatively small frequency range around a nominal value. This value may be different for different color systems.

A system for changing the nominal frequency without switching to a different crystal is shown in U.S. Pat. No. 4,682,209 (Nillesen). In the system described in that patent, the frequency of a digital oscillator is controlled by insertion of a quiescent frequency number to which is added a frequency error corresponding to the deviation from the desired quiescent frequency. However, there are no devices whose function it is to maintain the local oscillator frequency within a given frequency range.

U.S. Pat. No. 4,229,759 describes a control loop for a voltage controlled oscillator which may be the local oscillator in a color TV receiver. The burst signal and local oscillator signals are both applied to a wideband analog multiplier circuit whose outputs are sampled during the burst interval by sample-and-hold circuits. The outputs of the sample-and-hold circuits constitute the control signal for the local oscillator. The sample-and-hold circuit includes capacitors which are symmetrically bidirectionally charged and discharged to accommodate positive and negative frequency (phase) deviations. There is no monitoring in this system to return the local oscillator frequency to within a predetermined frequency range so that it can be locked to the burst.

In EP-A 0,132,196 the color subcarrier frequencies required for the different color television systems are generated by a voltage controlled oscillator whose output frequency is corrected on the basis of comparison with two reference frequencies.

SUMMARY OF THE INVENTION

It is, inter alia, an object of the present invention to monitor the frequency of an oscillator, such as the local oscillator in a color television receiver, and to maintain the output frequency of this oscillator within a predetermined frequency range.

It is a further object of this invention to do so utilizing only one reference frequency, preferably one which is available in any case in the receiver.

It is a further object of the present invention to allow the nominal oscillator frequency to be changed readily so that different color systems can be accommodated.

For this purpose, the invention provides an apparatus for maintaining the oscillator frequency of an oscillator within a frequency range determined by a reference frequency as recited in claim 1, in particular comprising means coupled to said oscillator for cyclically increasing and decreasing the contents of a storage means by predetermined increase and decrease amounts during predetermined increase and decrease periods which depend on said oscillator frequency and said reference frequency so that said contents reaches an extreme value when said oscillator frequency is within said frequency range and said contents passes a threshold value when said oscillator frequency passes a limit value of said frequency range. Advantageous embodiments are set out in the subclaims.

To stay within the frequency range determined by the reference frequency, increases and decreases of the contents of the storage means should be in equilibrium. This means that by altering the dependencies of the increase and decrease periods upon the oscillator and reference frequencies, an easy way is offered to change the relation between the oscillator frequency and the reference frequency. Altering the increase and decrease amounts will change this relation also. In a first embodiment, the storage means are formed by a capacitor. However, an up-down counter may be used as well. The oscillator can be a current (or voltage) controlled oscillator, but also a digitally controlled oscillator.

BRIEF DESCRIPTION OF THE DRAWING

These and other (more detailed) aspects of the invention will be described and elucidated with reference to the accompanying drawings.

In the drawings:

FIG. 2 illustrates the relevant time periods required for operation of the present invention; and FIGS. 3a–b illustrate the variations of the control signal for nominal frequency, maximum frequency and minimum frequency, both upon starting and during normal operation.

DESCRIPTION OF THE PREFERRED EMBODIMENTS

Figure 1:
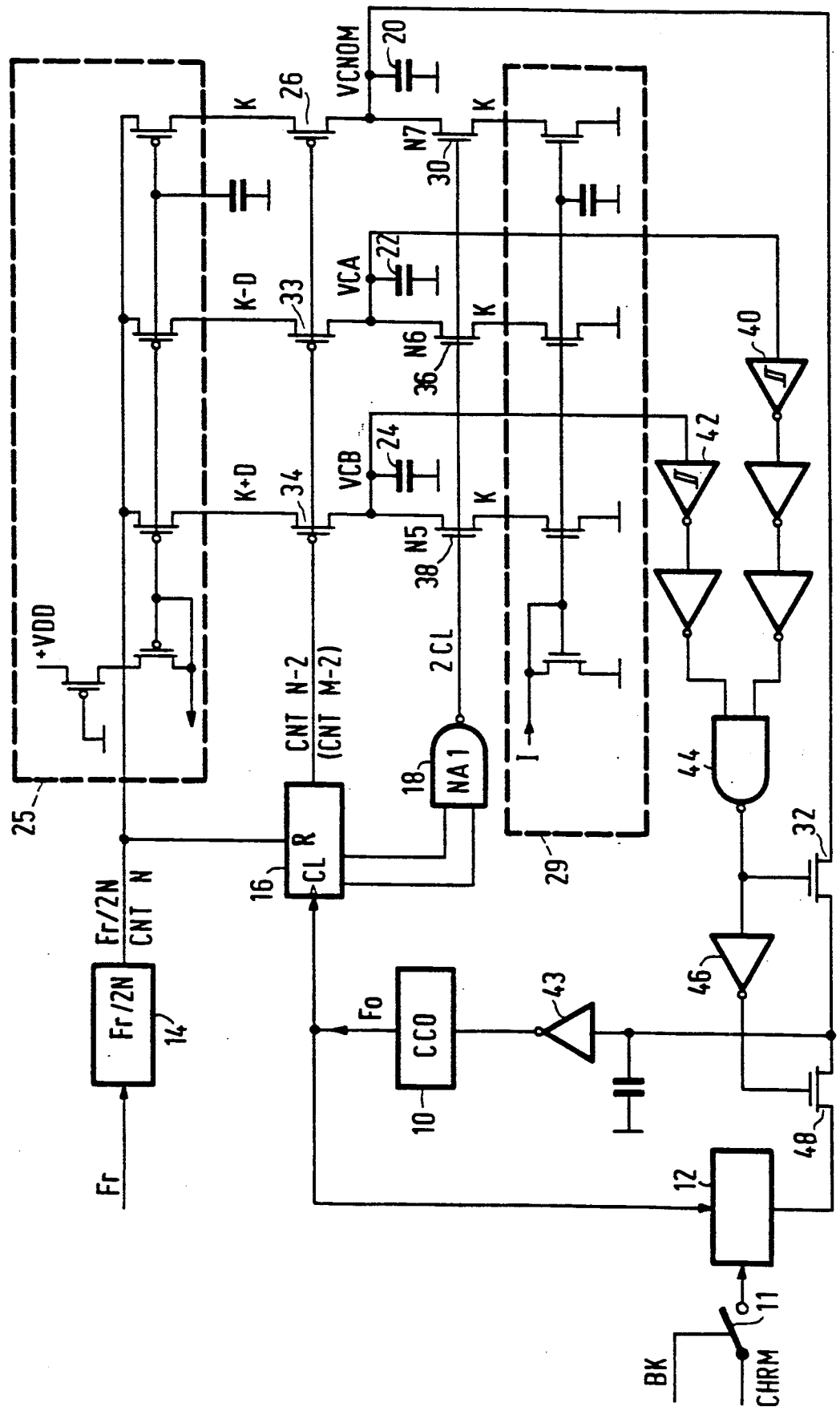
FIG. 1 is a block diagram of the frequency monitoring apparatus of the present invention.

The circuit illustrated in FIG. 1 controls the frequency Fo of a current controlled oscillator (CCO) 10 to be within a predetermined frequency range so that it is at all times able to lock on to a given phase control signal applied to a phase comparator 12. The phase control signal may, for example, be the color burst (CHRM) in a received color television signal. The color burst is applied to phase comparator 12 via a switch 11 which is controlled by a burst key signal BK. A local oscillator locked to the burst is required in order to reconstitute the suppressed subcarrier of the color difference signals. Since the burst is received during only a small percentage of the time of a television line, it is necessary that the oscillator frequency Fo be kept within certain frequency limits in the interval between bursts for proper receiver operation and to allow lock on to the next burst.

In the present invention this is accomplished by the use of a reference frequency Fr which preferably is a frequency already available in the receiver. The reference frequency Fr is divided by a factor of 2N in a frequency divider 14. The resulting waveform CNT N (count N) is pictured in FIG. 2 (uppermost curve). It is a square wave having half periods which each last for N periods of the reference frequency Fr. For purposes of this invention it is immaterial how this signal is derived. It must, however, be stable and accurate and independent of oscillator 10. The CNT N waveform is applied to the reset input R of a counter 16 which is a part of the control loop for oscillator 10.

The control loop is constituted as follows. The output of current controlled oscillator 10 is applied to the clock input CL of counter 16. Counter 16 counts to a maximum of M−2, a signal called "CNT M−2" (count M−2) being furnished as long as the counter is counting. As illustrated by the middle curve of FIG. 2, the CNT M−2 signal is high during M−2 periods of the oscillator frequency Fo of CCO 10. Further, a NAND-gate 18 is connected to two stages of counter 16 such that the output of NAND-gate 18 is a positive pulse covering two clock periods (2 CL) of the oscillator frequency Fo of CCO 10 as shown by the lowest curve of FIG. 2. Alternatively, the 2 CL pulse may consist of two pulses each covering a single clock period.

Also provided in the control loop are three capacitors, 20, 22, and 24, which determine, respectively, the nominal frequency of current controlled oscillator 10, the maximum frequency to which it will be allowed to rise, and the minimum frequency to which it will be allowed to drop. The charging current for all three capacitors is derived from a constant current source 25 controlled by the CNT N signal. The construction of such a constant current source is well known and does not form a part of the present invention. It therefore will not be explained in detail here. The charging current for capacitor 20, also known as the nominal capacitor, flows through a field effect transistor (FET) 26, connected to constant current source 25. FET 26 has a gate connected to receive the CNT M−2 signal at the output of counter 16. Charging of capacitor 20 takes place with a constant charging current denoted by K. The discharge path of capacitor 20 contains a current sink 29 which maintains the discharge current at a value K. The source-drain circuit of a field effect transistor 30 is interconnected between current sink 29 and capacitor 20. The gate of FET 30 receives the two clock period pulse 2 CL at the output of NAND-gate 18. Capacitor 20 can be connected to the control input of oscillator 10 via a switch (preferably also a field effect transistor) 32. When switch 32 is closed, capacitor 20 is connected through an inverter 43 to the control input of oscillator 10.

The charge on capacitors 22 and 24 is controlled similarly to that across the capacitor 20, except that the constant charging currents from constant current source 25 are K−D and K+D, respectively. Thus, charging of capacitor 22 takes place through FET switch 33 and charging of capacitor 24 takes place through FET switch 34, both having a control input connected to the CNT M−2 output of counter 16. Constant current discharge of both capacitors takes place through respective FET switches 36 and 38 controlled by the two clock period pulse output 2 CL at the output of NAND gate 18. The voltage across capacitor 22 is applied to a threshold circuit 40, while the voltage across capacitor 24 is applied to a threshold circuit 42. The outputs of both threshold circuits, following requisite inversion, are applied to respective inputs of a NAND-gate 44 whose output controls switch 32. Further, an inverter 46, also connected to the output of NAND-gate 44, has an output connected to the control input of a FET switch 48 which closes the loop between phase comparator 12 and current controlled oscillator 10.

The operation of this circuit is as follows. Application of the CNT N signal to the reset input R of counter 16 causes the counter to count when CNT N is high, and to be reset during the time CNT N is low. The counter 16 counts to count M−2. Also derived from the counter 16 is a pulse (2 CL) at the output of NAND-gate 18 which lasts for two clock periods. The three pulses CNT N, CNT M−2 and the two clock periods pulse 2 CL control the charging and discharging of all three capacitors 20, 22 and 24.

It will now be assumed that the oscillator frequency Fo of CCO 10 is the same as the reference frequency Fr, in which case M preferably equals N, and that the initial charge on capacitors 20, 22 and 24 is the same. The leading edge of the CNT N signal initiates constant current charging of capacitor 20 by constant current source 25 via FET switch 26. The leading edge of the CNT N−2 signal opens FET switch 26 and therefore stops the charging of capacitor 20.

The discharge of capacitor 20 is initiated by the two clock periods pulse 2 CL via closing of FET switch 30 and is maintained for the two clock periods.

The negative going edge of CNT N−2 (see also the middle curve of FIG. 2) restarts the charging of capacitor 20 with current K. This charging process is terminated by the negative edge of the CNT N signal which stops the operation of constant current source 25. The charging is thus stopped at the exact moment in which the charge across capacitor 20 is the same as at the start of the cycle.

Effectively, capacitor 20 was charged during the time corresponding to (count N)−(count N−2), i.e. two clock periods, and was discharged during two clock periods. Thus, as long as the clock frequency of CCO 10 and the reference frequency are the same, the charge state of capacitor 20 will remain the same at the end of each cycle, regardless of the phase relationship between the oscillator frequency Fo and the reference frequency Fr. Reference to FIG. 2 will show that any change in the first charge time resulting from a changed phase relationship between the reference frequency Fr and the clock frequency Fo of CCO 10 will be compensated by an equal change in the opposite direction in the second charge time.

For capacitor 22, it will be noted that the discharge time and the discharge current are the same as for capacitor 20. Charging of capacitor 22 also takes place in the same manner as the charging of capacitor 20, but the constant charging current value is K−D rather than K. Since the discharge time and current are the same as those of capacitor 20, as is the charging time, but the charge current is less, the charge on capacitor 22 will decrease somewhat during each cycle that the frequency Fo of oscillator 10 is within the desired range. Thus, after a determined number of cycles, the voltage across capacitor 22 will reach its lowest possible value.

At the same time that the voltage across capacitor 22 reaches its lowest possible value, that across capacitor 24 will reach its highest possible value since all charge and discharge conditions are the same as for capacitor 20, but the charge current is K+D. Thus, as long as the frequency Fo of the oscillator 10 is within the predetermined range or window, the voltages across capacitors 20, 22 and 24 will settle to the values indicated as VCNOM, VCA and VCB in FIG. 3a.

As the frequency Fo of oscillator 10 increases, i.e. becomes higher than the reference frequency Fr, the charging time for all capacitors increases since the time that counter 16 counts decreases, increasing the time intervals between the CNT N and CNT N−2 signals. The discharge time decreases also, but by a factor 2/(N−2) less. However, as long as more charge is discharged from capacitor 22 than is added during the charging period, the voltage across capacitor 22 will remain low. However, as the clock frequency of CCO 10 increases, the time will be reached at which the charge added and subtracted during the cycle are equal. At this point $$(2 \text{ clock periods}) * K = [N*Tr − (N−2)*To] * (K−D),$$

in which Tr is one period of the reference frequency Fr and To is one period of the oscillator frequency Fo of CCO 10.

This defines the maximum frequency which the oscillator 10 may reach. As soon as the clock frequency Fo increases beyond this point, the voltage across capacitor 22 will increase. As it increases, it will pass the threshold of threshold stage 40, which causes the output of NAND-gate 44 to go high and FET switch 32 to be closed while FET switch 48 is opened. The voltage across capacitor 20 will now cause the frequency Fo of oscillator 10 to return to a frequency within the desired frequency window.

When the oscillator frequency Fo returns to a value in the frequency window, the voltage across capacitor 22 will start to decrease. When it reaches a value which is less than the lower threshold of threshold stage 40, the output of NAND-gate 44 will change, the loop between the oscillator 10 and the incoming bursts will be reestablished, while the loop between the oscillator and capacitor 20 will be broken. The oscillator is then again in a position to lock to the external color burst.

The charge and discharge cycles for capacitor 24, which sets the minimum frequency of the window, is identical to that discussed with respect to capacitor 22 except that the voltage across capacitor 24 will increase as long as the frequency of CCO 10 is within the prescribed limits and will commence to decrease when this frequency leaves these limits.

FIG. 3b illustrates the variations of the voltage across capacitors 22 and 24 (VCA and VCB, respectively) for varying frequencies of oscillator 10. After the initial phase illustrated in FIG. 3a, while the oscillator frequency Fo of CCO 10 (shown at the left side of the uppermost part of FIG. 3b) remains constant, VCB is at a maximum value while VCA is at a low value, as shown in the middle part of FIG. 3b. A certain increase in frequency at point T1 results in an increase in the voltage VCA. When this voltage passes the upper threshold of threshold stage 40 as indicated by dashed line ThU40 in the middle part of FIG. 3b, FET switch 48 opens and FET switch 32 closes so that capacitor 20 is connected to oscillator 10. This switching is shown in the lowest part of FIG. 3b. The oscillator frequency Fo of CCO 10 begins to decrease.

The decrease in frequency stops the increase of voltage VCA. As the clock frequency Fo re-enters the frequency window shown by dashed lines in the uppermost part of FIG. 3b, VCA begins to decrease. It continues to decrease until its value is less than the lower threshold ThL40 of threshold stage 40, at which point the control loop is switched off by opening FET switch 32 and switch 48 is again closed. A similar cycle is executed by VCB in response to the drop in frequency illustrated at point T2.

The operation of the circuit can be improved if the voltage VCNOM of capacitor 20 is only passed to CCO 10 when the CNT N signal is low, i.e. when the voltage VCNOM is stable and not altered by charging or discharging capacitor 20. A suitably controlled sample and hold circuit between capacitor 20 and FET switch 32 will do for this purpose.

The above was a description of the operation of the circuit for a given nominal frequency of oscillator 10. However, for different color systems, it is necessary that different values of frequency for oscillator 10 can be set. This is readily accomplished by means of the present invention.

In the example shown in the drawing, the reference frequency Fr and the clock or oscillator frequency Fo of CCO 10 were chosen to be the same. However, it is possible to develop an oscillator frequency Fo which is somewhat different from the reference frequency Fr by changing the relationship between the charge and discharge currents of the capacitors. Thus the minimum change in oscillator frequency is not determined by the change which would be caused by letting, for example, counter 16 count to one count more or less. Smaller increments can be obtained by the abovementioned change in the charge-discharge current relationship.

For example, if the charge current is doubled, the charging time must be halved in order to maintain equilibrium conditions. This causes the oscillator frequency to change from Fo=Fr to Fo=Fr * (N−1)/N, as will be shown below. In equilibrium, charge and discharge should be equal. In formulae, in which Kc is the charge current, Kd is the discharge current, M−X is the final count of counter 16 (X being a generalization of 2), Tr is one period of the reference frequency Fr and To is one period of the oscillator frequency Fo of CCO 10:

$$Kc * [N * Tr − (M − X) * To] = Kd * X * To <=>$$
$$Kc * N * Tr = [Kc * (M − X) + Kd * X] * To <=>$$
$$Fo = Fr * [Kc * (M − X) + Kd * X]/[Kc * N] <=>$$
$$Fo = Fr * [(M − X) + X * Kd/Kc]/N$$

If M equals N, X equals 2, Kc equals twice Kd, the oscillator frequency is changed from Fo=Fr to Fo=Fr * (N−1)/N. By choosing current values which are between K and 2K, any frequency between Fo and Fo * (N−1)/N can be chosen.

X should be greater than one to avoid errors which may occur when a leading edge of the CNT M−2 signal immediately follows a leading edge of the CNT N signal. On the other hand, X should be small, preferably 2, to minimize an amplification of any errors in the currents Kd and Kc.

By selecting appropriate values for M and N, an arbitrary integer relation between the reference frequency Fr and the oscillator frequency Fo can be chosen. If it is desired to keep the integer values of this integer relation small, which implies that simple dividers can be used, the tuning obtained by the setting of the values for M and N which is accurate but which may not yield the desired frequency exactly, can be supplemented by a fine tuning which can be obtained by selecting appropriate charging and discharging current values.

The fact that an arbitrary frequency can be set for oscillator 10 just by choice of values of M and N and the charge and discharge current values makes the present application particularly suitable for use in monitoring and maintaining the local oscillator frequency of a color TV receiver at any one of the values required by the different color systems. Further, minimal chip surfaces are needed for most applications. The correct frequencies and frequency variations can be obtained without the many additional components such as flipflops and other logic circuits required in the past.

The present invention thus provides a simple, reliable method for adapting an oscillator to one of a plurality of frequencies and to hold it within a predetermined frequency window around any of these frequencies. This ensures that the oscillator will be able to phaselock to signals received at any of these frequencies.

After switching on the apparatus, the desired frequency of CCO 10 may be reached faster when the circuit is modified as set out below. Starting from an oscillator frequency which is too low and a corresponding value of VCNOM which is too high, the charging period of capacitor 20 can be shortened if counter 16 is not reset at the trailing edge of the CNT N signal, but by a reset pulse which occurs only shortly before the leading edge of the CNT N signal. Such a reset pulse can be obtained from and AN circuit (not shown) having a non-inverting input coupled to the output of divider 14, an inverting input coupled via a one clock pulse delay (not shown) to the output of divider 14, and an output coupled to the reset input of counter 16. The one clock pulse delay furnishes the CNT N signal. A further speeding-up can be obtained if a special discharge circuit is coupled to capacitor 20, which discharge circuit is active when the CNT N signal is low and the CNT N−2 signal is high, a situation which only occurs when the oscillator frequency Fo is low in comparison with the reference frequency Fr, so that the CNT N−2 signal is still high after the trailing edge of the CNT N signal.

Although, the invention was illustrated in a particular preferred embodiment, other variations including different components and applications to other than color television receivers will readily occur to one skilled in the art and are intended to be encompassed in the following claims.

I claim:

1. Apparatus for maintaining the frequency of an oscillator within a frequency range determined by a reference frequency, comprising:
    first storage means;
    first means coupled to said oscillator for cyclically increasing and decreasing a contents of said first storage means by predetermined first increase and decrease amounts during predetermined increase and decrease periods which depend on said oscillator frequency and said reference frequency so that said contents reach a first extreme value when said oscillator frequency is within said frequency range and said contents passes a first threshold value when said oscillator frequency passes a first limit value of said frequency range;
    first threshold means coupled to said first storage means for supplying first threshold signals when said contents of said first storage means passes said first threshold value; and
    control means coupled to said first threshold means for controlling said oscillator in response to said first threshold signals.

2. Apparatus as claimed in claim 1, further comprising:
    second storage means;
    second means coupled to said oscillator for cyclically increasing and decreasing a contents of said second storage means by predetermined second increase and decrease amounts during predetermined increase and decrease periods which depend on said oscillator frequency and said reference frequency so that said contents reach a second extreme value when said oscillator frequency is within said frequency range and said contents passes a second threshold value when said oscillator frequency passes a second limit value of said frequency range;
    second threshold means coupled to said second storage means for supplying second threshold signals when said contents of said second storage means passes said second threshold value; and wherein
    said control means are also coupled to said second threshold means for controlling said oscillator in response to said first and second threshold signals.

3. Apparatus as claimed in claim 1, wherein said cyclically increasing and decreasing means comprise:
    means for supplying a reference signal having a reference frequency;
    means for increasing said contents during said increase periods, said increase periods varying in dependence on both said reference frequency and said oscillator frequency; and
    means for decreasing said contents during said decrease periods, said decrease periods depending only on said oscillator frequency.

4. Apparatus as claimed in claim 3, wherein
    said storage means are charge storage means;
    said increasing means are constant charge current furnishing means for furnishing said predetermined increase amounts; and
    said decreasing means are constant discharge current furnishing means for furnishing said predetermined decrease amounts.

5. Apparatus as claimed in claim 4, further comprising:
    means coupled to said reference signal supplying means for furnishing a first signal extending for a time equal to the time of N cycles of said reference frequency;
    means coupled to said oscillator for furnishing a second signal extending for a time equal to the time of N−X cycles of said oscillator frequency, X being an integer greater than one and less than N; and wherein
    said increasing means include means for adding to said contents only in the presence of said first signal and in the absence of said second signal.

6. Apparatus as claimed in claim 5, further comprising:
    means coupled to said oscillator for furnishing a third signal extending for a time equal to the time of X cycles of said oscillator frequency; and wherein
    said decreasing means include means for subtracting from said contents in the presence of said third signal.

7. Apparatus as claimed in claim 6, wherein said second signal furnishing means include a counter having a reset input coupled to receive said first signal, a counting input coupled to said oscillator, and a counting output for furnishing said second signal.

8. Apparatus as claimed in claim 7, wherein said third signal furnishing means include logic circuit means coupled to said counter.

9. Apparatus as claimed in claim 2 wherein said control means comprise:
   third storage means;
   third means coupled to said oscillator for cyclically increasing and decreasing the contents of said third storage means by predetermined third increase and decrease amounts during predetermined increase and decrease periods which depend on said oscillator frequency and said reference frequency; and
   means for coupling said third storage means to said oscillator in response to said threshold signals thereby to adjust the oscillator frequency.

10. Apparatus as claimed in claim 2, wherein said cyclically increasing and decreasing means comprise:
    means for supplying a reference signal having a reference frequency;
    means for increasing said contents during said increase periods, said increase periods varying in dependence on both said reference frequency and said oscillator frequency; and
    means for decreasing said contents during said decrease periods, said decrease periods depending only on said oscillator frequency.

11. Apparatus as claimed in claim 10, wherein
    said storage means comprise charge storage means;
    said increasing means are constant charge current furnishing means for furnishing said predetermined increase amounts; and
    said decreasing means are constant discharge current furnishing means for furnishing said predetermined decrease amounts.

12. Apparatus as claimed in claim 11, further comprising:
    means coupled to said reference signal supplying means for furnishing a first signal extending for a time equal to the time of N cycles of said reference frequency;
    means coupled to said oscillator for furnishing a second signal extending for a time equal to the time of $N-X$ cycles of said oscillator frequency, X being an integer greater than one and less than N; and wherein
    said increasing means includes means for adding to said contents only in the presence of said first signal and in the absence of said second signal.

13. Apparatus as claimed in claim 12, further comprising:
    means coupled to said oscillator for furnishing a third signal extending for a time equal to the time of X cycles of said oscillator frequency; and wherein
    said decreasing means includes means for subtracting from said contents in the presence of said third signal.

14. Apparatus as claimed in claim 13, wherein said control means comprise:
    third storage means;
    third means coupled to said oscillator for cyclically increasing and decreasing a contents of said third storage means by predetermined third increase and decrease amounts during predetermined increase and decrease periods which depend on said oscillator frequency and said reference frequency; and
    means for coupling said third storage means to said oscillator in response to said threshold signals.

15. Apparatus as claimed in claim 3, further comprising:
    means coupled to said reference signal suppling means for furnishing a first signal extending for a time equal to the time of N cycles of said reference frequency;
    means coupled to said oscillator for furnishing a second signal extending for a time equal to the time of $N-X$ cycles of said oscillator frequency, X being an integer greater than one and less than N; and wherein
    said increasing means includes means for adding to said contents only in the presence of said first signal and in the absence of said second signal.

16. Apparatus as claimed in claim 15, further comprising:
    means coupled to said oscillator for furnishing a third signal extending for a time equal to the time of X cycles of said oscillator frequency; and wherein
    said decreasing means includes means for subtracting from said contents in the presence of said third signal.

17. Apparatus as claimed in claim 15, wherein said second signal furnishing means includes a counter having a reset input coupled to receive said first signal, a counting input coupled to said oscillator, and a counting output for furnishing said second signal.

18. Apparatus as claimed in claim 10, wherein said control means comprise:
    third storage means;
    third means coupled to said oscillator for cyclically increasing and decreasing the contents of said third storage means by predetermined third increase and decrease amounts during predetermined increase and decrease periods which depend on said oscillator frequency and said reference frequency; and
    means for coupling said third storage means to said oscillator in response to said threshold signals thereby to adjust the oscillator frequency.

19. Apparatus as claimed in claim 15 wherein said means for coupling said third storage means to said oscillator comprise a first switching transistor selectively coupling said third storage means to a control input of the oscillator and having a control electrode controlled by said first and second threshold means.

20. Apparatus as claimed in claim 19 further comprising a phase comparator having a first terminal coupled to an input terminal for a source of signals of different possible frequencies, a second terminal coupled to an output of the oscillator, and a third terminal coupled to said control input of the oscillator via a second switching transistor controlled by said first and second threshold means in synchronism with said first switching transistor.

* * * * *